United States Patent [19]
Okabe et al.

[11] Patent Number: 5,663,099
[45] Date of Patent: Sep. 2, 1997

[54] METHOD FOR PRODUCING SEMICONDUCTOR DEVICE HAVING ALIGNMENT MARK

[75] Inventors: Takahiko Okabe, Isehara; Genzo Monma, Tokyo; Hiroshi Yuzurihara, Isehara, all of Japan

[73] Assignee: Canon Kabushiki Kaisha, Tokyo, Japan

[21] Appl. No.: 536,791

[22] Filed: Sep. 29, 1995

Related U.S. Application Data

[63] Continuation of Ser. No. 183,254, Jan. 19, 1994, Pat. No. 5,482,893, which is a continuation of Ser. No. 722,107, Jun. 27, 1991, abandoned.

[30] Foreign Application Priority Data

Jun. 29, 1990 [JP] Japan ..................... 2-169948
Jun. 29, 1990 [JP] Japan ..................... 2-169949

[51] Int. Cl.$^6$ .................................... H01L 21/441
[52] U.S. Cl. ............... 438/642; 438/675; 438/681; 438/975
[58] Field of Search ..................... 437/192, 194, 437/195, 924, 199, 198, 189; 148/DIG. 102; 118/719

[56] References Cited

U.S. PATENT DOCUMENTS

| | | |
|---|---|---|
| 4,630,357 | 12/1986 | Rogers et al. . |
| 4,641,420 | 2/1987 | Lee . |
| 5,083,364 | 1/1992 | Olbrich et al. . |
| 5,179,042 | 1/1993 | Mikoshiba et al. . |
| 5,192,680 | 3/1993 | Naruse et al. . |

FOREIGN PATENT DOCUMENTS

| | | |
|---|---|---|
| 212219 | 7/1986 | European Pat. Off. . |
| 0199030 | 10/1986 | European Pat. Off. . |
| 60-229334 | 11/1985 | Japan . |
| 230113 | 1/1990 | Japan . |
| 250414 | 2/1990 | Japan . |

OTHER PUBLICATIONS

Patent Abstracts of Japan, vol. 8, No. 142, English Abstract of Japanese Patent No. 59 052 867, Jul. 3, 1992.
"Alignment Aid for Stud Up Technology", *Research Disclosure*, No. 303, p. 494, Jul. 1989.
"Multilevel Metal Direct Writer Resignation", E. Berndlmaier, et al., *IBM Technical Disclosure Bulletin*, vol. 24, No. 7B, pp. 3852–3853, Dec., 1981.
Research Disclosure No. 30327, "Alignment for Stud Up Technology" Jul., 1989.

*Primary Examiner*—John S. Maples
*Attorney, Agent, or Firm*—Fitzpatrick, Cella, Harper & Scinto

[57] ABSTRACT

An alignment method for a semiconductor device having a conductive thin film on a conductive substrate surface across an insulation film, comprises steps of: forming in the insulation film, at least two apertures exposing the substrate surface therein; selectively depositing a conductive material in the apertures thereby forming a stepped portion in at least one of said apertures; and forming the conductive thin film at least on said insulation film. The alignment is conducted utilizing the stepped portion.

8 Claims, 9 Drawing Sheets

METHOD FOR PRODUCING SEMICONDUCTOR DEVICE HAVING ALIGNMENT MARK

This application is a continuation of application Ser. No. 08/183,254 filed Jan. 19, 1994, now U.S. Pat. No. 5,482,893 which is a continuation of application No. 07/722,107 filed Jun. 27, 1991, now abandoned.

BACKGROUND OF THE INVENTION

1. Field of the Invention

The present invention relates to a method for producing a semiconductor device such as a memory, a photoelectric converting device, a signal processing device or the like adapted for use in various electronic appliances, and more particularly to a method for producing a semiconductor device featuring an alignment mark structure.

2. Related Background Art

In the formation of wiring layers by patterning in conventional semiconductor devices, the precision of the patterning is improved by automatic alignment utilizing a recess, formed in a predetermined position in advance, as a mark. For example, in a conventional semiconductor device including a CMOS transistor as shown in FIG. 1, oxide films 2, 4 on the principal surface of a substrate 1 are partially removed at a predetermined position by selective etching to expose the silicon surface, thus forming a mother mark 6. Then, the entire substrate surface, including the mother mark 6, is covered by a metal film 9, thereby forming a recess 10 on the metal film, corresponding to the form of the mother mark 6. A wiring layer of a desired pattern is obtained by patterning the metal film, utilizing auto-alignment achieved by irradiating the recess with a laser beam and detecting the reflected light, or by utilizing data obtained by image processing such as TV-AA (television auto-alignment).

However, in such a conventional semiconductor device, if the metal film is formed by a selective metal depositing method such as tungsten chemical vapor deposition method (CVD) to a thickness required for the wiring layer, the mother mark area and the metal film therearound become flat so that the recess corresponding to the mother mark is no longer formed, because of the selective growth characteristic of the depositing method. Consequently the detection of the mother mark, essential for auto alignment, becomes difficult and the precision of alignment significantly deteriorates.

FIG. 2 shows the wiring layer formed by selected deposition utilizing the tungsten CVD mentioned above.

On the mother mark 6, a metal film composed of tungsten is deposited to the level of the insulation film 4, so that the portion 10, which is to serve as an alignment mark in a next step, has become flat.

SUMMARY OF THE INVENTION

In consideration of the technical drawbacks of the prior technology mentioned above, an object of the present invention is to provide a semiconductor device allowing easy confirmation of the position of a mother mark for mask alignment and enabling a high-density wiring structure, a producing method therefor and an alignment method therefor.

Another object of the present invention is to provide a method for producing a semiconductor device having a conductive thin film on a conductive substrate across an insulation film, comprising steps of forming at least two apertures in the insulation film to expose the substrate therein, selectively depositing a conductive material in the apertures thereby forming a stepped portion at least in one of the apertures, and forming the conductive film at least on the insulation film, wherein the stepped portion is utilized for alignment.

As the present invention is capable, utilizing selective metal deposition by a novel chemical vapor deposition (CVD) method, of forming a portion faithfully corresponding to the form of a stepped portion constituting an alignment mark on a conductive film, a faithful photoresist pattern can be formed on the substrate surface by auto-alignment in the patterning of a wiring layer.

Still another object of the present invention is to provide a method for producing a semiconductor device having a conductive thin film on a conductive substrate across an insulation film, comprising steps of forming an aperture in the insulation film to expose the substrate surface, forming a stepped portion not exposing the substrate surface in the insulation film, selectively depositing a conductive material in the aperture, and forming the conductive film at least on the insulation film, wherein the stepped portion is utilized for alignment.

The present invention is capable, utilizing selective metal deposition by a novel CVD method, of selectively depositing a conductive material solely in the aperture exposing the conductive substrate surface, thereby forming a conductor. By forming a conductive layer by non-selective deposition, on the above-mentioned conductor and on a stepped portion formed in the insulation film on the substrate surface, a portion corresponding to the form of the stepped portion can be formed in the thus obtained conductive layer. The portion can be utilized as an alignment mark to achieve formation of a faithful wiring pattern by auto-alignment in the patterning of the conductive layer.

DESCRIPTION OF THE PREFERRED EMBODIMENTS

Figure 1:
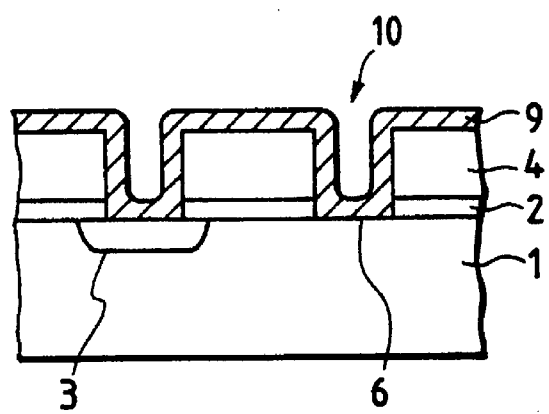
FIGS. 1 and 2 are schematic views showing conventional methods for forming an alignment mark.
Figure 2:
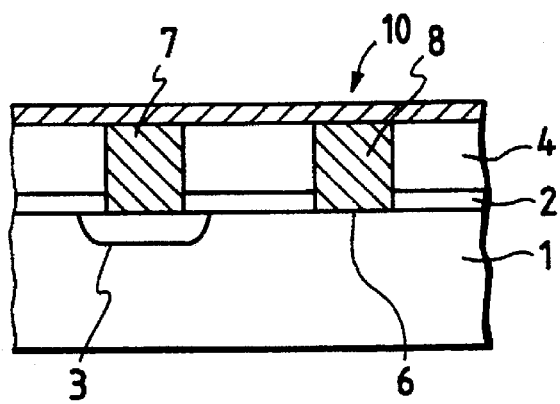

The present invention includes a method for producing a semiconductor device and an alignment method therefor.

For example, the present invention includes an alignment method for a semiconductor device having a conductive thin film on a conductive substrate surface across an insulation film, comprising steps of:

forming at least two apertures exposing the substrate surface therein in the insulation film;

selectively depositing a conductive material in the apertures to bury the apertures, thereby forming a stepped portion at least in one of the apertures; and forming the conductive thin film at least on the insulation film;

wherein alignment in patterning the conductive thin film is conducted utilizing the stepped portion.

Also the present invention includes a method for producing a semiconductor device having a wiring layer on a conductive substrate surface across an insulation film, comprising steps of:

forming at least two apertures in the insulation film, exposing the substrate surface;

selectively depositing a conductive material in the apertures thereby forming a stepped portion serving an alignment mark in at least one of the apertures;

forming a conductive thin film for forming the wiring layer at least on the insulation film; and forming the wiring layer by patterning the conductive thin film by mask alignment with the stepped portion as the alignment mark.

Furthermore the present invention includes an alignment method for a semiconductor device having a conductive thin film on a conductive substrate surface across an insulation film, comprising steps of:

forming an aperture exposing the substrate surface in the insulation film;

forming a stepped portion not exposing the substrate surface in the insulation film;

selectively depositing a conductive material in the aperture; and forming the conductive thin film at least on the insulation film;

wherein alignment is conducted utilizing the stepped portion.

Furthermore the present invention includes a method for producing a semiconductor device having a wiring layer on a conductive substrate surface across an insulation film, comprising steps of:

forming an aperture exposing the substrate surface in the insulation film;

forming a stepping portion not exposing the substrate surface in the insulation film;

selectively depositing a conductive material in the aperture;

forming a conductive thin film for forming the wiring layer at least on the insulation film; and forming the wiring layer by patterning the conductive thin film, by mask alignment utilizing the stepped portion as an alignment mark.

In the execution of the present invention, the shape of the stepped portion serving as an alignment mark and the planar form thereof are not particularly limited but are only required to be large enough for providing a mark detection signal for alignment. The step is preferably 400 Å or larger, and most preferably 500 Å or larger.

Also the method for depositing metal in contact holes for wiring is preferably a selective deposition of a metal film principally composed of aluminum, utilizing alkylaluminum hydride gas and hydrogen.

[Embodiment 1]

Now the present invention will be clarified in detail by an embodiment shown in the attached drawings.

Figure 3:
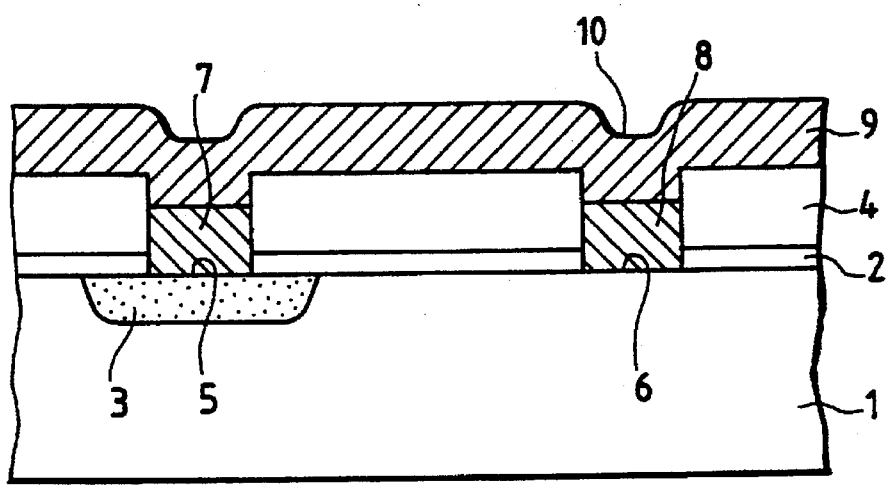
FIG. 3 is a schematic view showing a method for forming an alignment mark according to a first embodiment of the present invention.

FIG. 3 illustrates a semiconductor device constituting a preferred embodiment of the present invention. A semiconductor substrate 1 is composed for example of silicon, and is provided thereon with functional elements such as MOS transistors, bipolar transistors or the like. On the principal surface of the substrate 1 there are formed, in succession, a thermal oxide film 2 and an interlayer insulation film 4, in which opened are a contact hole 5 and a mother alignment mark 6 constituting a stepped portion. In the present embodiment, the contact hole 5 and the mother mark 6 have the same planar area. A diffusion layer 3 is formed from the bottom of the contact hole 5 to the interior of the semiconductor substrate 1.

In the contact hole 5 and mother mark 6, there is selectively deposited a conductive material such as aluminum by a special CVD method to be explained layer, thereby forming a wiring layer 7 and a metal film 8, formed as conductors positioned lower than the upper surface of the interlayer insulation film 4. Also a wiring layer 9 composed of a non-selectively deposited conductive layer, is formed on the wiring layer 7 and metal film 8, and on the interlayer insulation film 4.

In the semiconductor device of such a structure, a recess 10 is formed in the wiring layer 9 above the mother mark 6, as a stepped portion corresponding to the form of the step in the mother mark 6, and is used as an alignment mark for auto-alignment in the patterning of the wiring layer 9. In the semiconductor device, since the recess 10 can be formed precisely at the position of the mother mark 6 mentioned above, the wirings can be obtained precisely according to the design, by a patterning operation utilizing the recess 10 as the alignment mark. Since the patterning is not positionally aberrated, high-density wirings are also possible.

The metal to be employed for electrode leads and wirings can be Al, an alloy principally composed of aluminum such as Al—Si, Al—Cu, Al—Si—Ti or Al—Si—Cu; Cu, Mo or W or alloys thereof. For filling the contact hole for electrode extraction, there is preferably employed the Al-CVD method to be explained later. The insulation film is preferably composed of an inorganic material such as silicon oxide or silicon nitride formed by CVD or sputtering, PSG (phosphosilicate glass) or PBSG (borophosphosilicate glass), or an organic material such as polyamide. The wiring layer on the insulation film can be formed for example by forming a metal layer by CVD or sputtering on the entire insulation film followed by patterning of the metal layer into the form of desired wirings by a photolithographic process, or by modifying the desired parts of the insulation film and depositing a metal selectively on thus modified surfacial parts.

The stepped portion 10 for alignment has a step preferably of 400 Å or larger, and more preferably of 500 Å or larger.

Figure 4A:
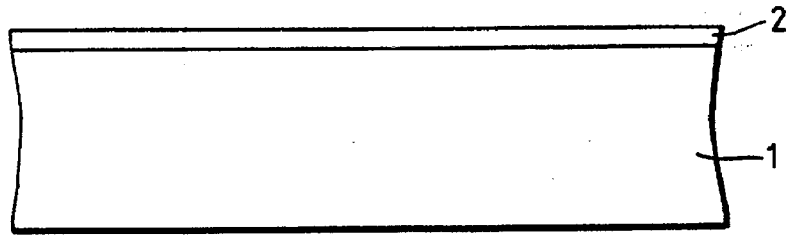
FIGS. 4A to 4D are schematic views showing a method for producing a semiconductor device according to the first embodiment.
Figure 4B:
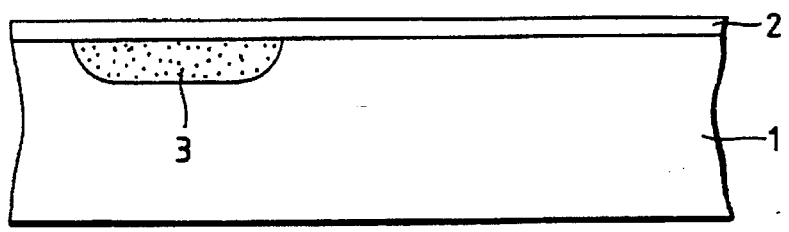
Figure 4C:
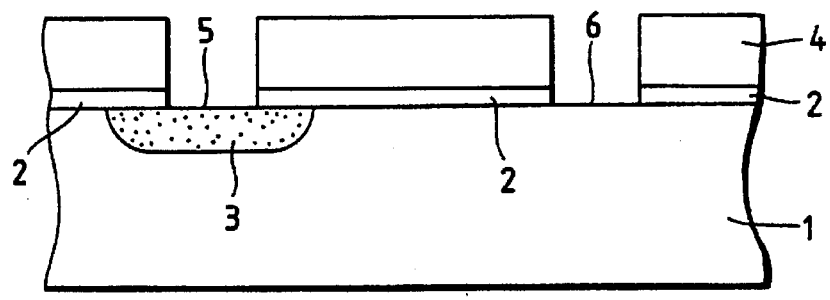

In the following there will be explained the method for producing the semiconductor device shown in FIG. 3, with reference to FIGS. 4A to 4D At first, on a silicon semiconductor substrate 1, constituting a conductive substrate and bearing functional elements such as MOS transistors or bipolar transistors, a thermal silicon oxide film 2 is formed by CVD (FIG. 4A). Then, with patterned photoresist, ion implantation is conducted in a predetermined area of the thermal oxide film 2, and a thermal treatment is applied to form a diffusion layer 3 (FIG. 4B). Subsequently an interlayer insulation film 4 of silicon nitride is deposited by CVD on the thermal oxide film 2, then heat treated, and subjected to contact patterning. Subsequently a contact hole 5 for electrode extraction and a stepped mother mark 6 of the same planar area as that of the contact hole 5 are formed by etching to the surface of the semiconductor substrate 1 (FIG. 4C). Then Al—Si is selectively deposited in the contact hole 5 and mother mark 6 to form a first conductive wiring layer 7 in the contact hole 5 and a conductive metal film 8 in the mother mark 6. In the present embodiment, the formation of the metal film 8 is terminated at a level lower than the upper surface of the interlayer insulation film 4, whereby the metal film 8 constitutes a stepped recess to the surrounding interlayer insulation film 4. Also in this embodiment, since the contact hole 5 and the mother mark 6 have the same planar area, the first wiring layer 7 and the metal film 8 are present at the same height from the surface of the substrate 1 (FIG. 4D).

Figure 4D:
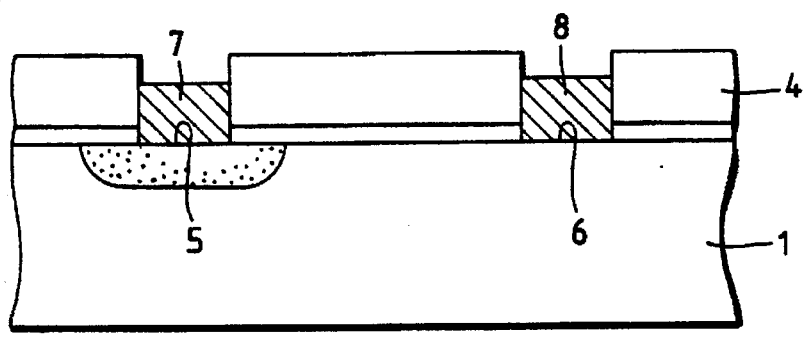

Subsequently, the entire surface of the semiconductor substrate 1 shown in FIG. 4D is modified by RF plasma treatment, and Al—Si is non-selectively deposited over the entire surface by CVD to form a second wiring layer 9. Thus, the recessed form of the mother mark 6 is reflected in the upper surface of the second wiring layer 9 to form a stepped recess 10 (cf. FIG. 3). The patterning operation of the wiring layer with automatic mask alignment, by irradiating the recess 10 with a laser beam and detecting the reflected light, allows the forming of desired wiring patterns exactly on the semiconductor substrate 1 and improves the production yield of the semiconductor device.

In the above-explained embodiment, prior to the formation of the second wiring layer 9 on the interlayer insulation film 4, the surface thereof may be planarized by a SOG (spin-on glass) method. More specifically, a solution of silanol compound in organic solvent (alcohol or ketone) is spin coated with a spin coater for 15–30 seconds at a revolution of 3,000–6,000 rpm, with a back rinse with isopropyl alcohol, and the semiconductor substrate is baked on a hot plate for 1–3 minutes at 80°–200° C. The surface irregularities of the interlayer insulation film are almost eliminated by such process, so that the second wiring layer becomes free from an increase in resistance or breakage at steps, resulting from such surface irregularities.

[Embodiment 2]

Figure 5:
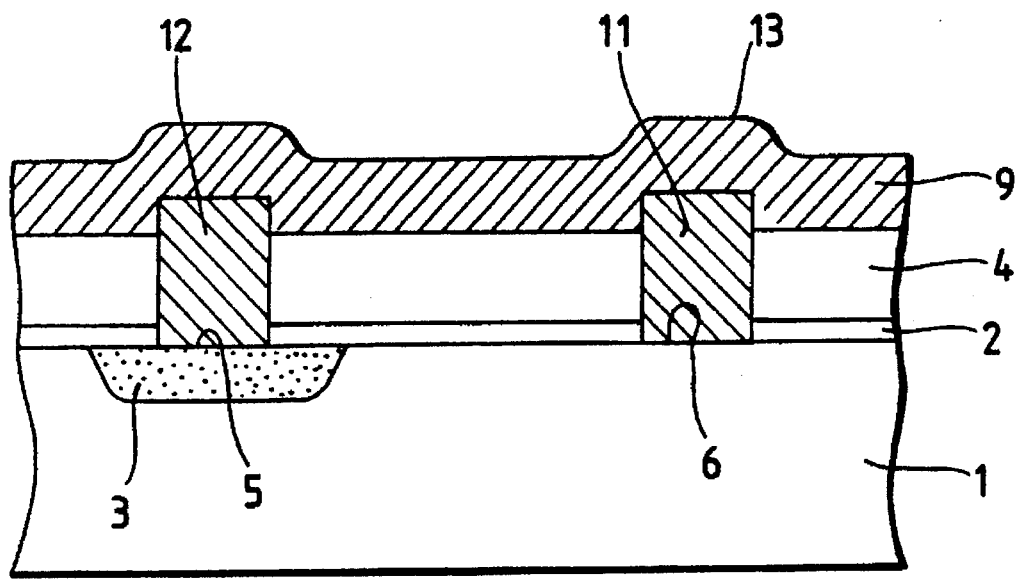
FIG. 5 is a schematic view showing a method for forming an alignment mark according to a second embodiment of the present invention.

FIG. 5 is a schematic cross-sectional view showing another preferred embodiment of the present invention, in which, in contrast to the structure shown in FIG. 3, a metal film 11 on the stepped mother mark 6 and a wiring layer 12 for electrode extraction are deposited higher than the upper surface of the interlayer insulation film 4. In this embodiment, therefore, a projection 13 is formed on the upper surface of a metal film 9 above the mother mark 6, corresponding to the form of the mother mark 6. The projection 13 can be used as an alignment mark for automatic mask alignment in the patterning of the wiring layer, in a similar manner as the recess 10 explained before.

[Embodiment 3]

Figure 6:
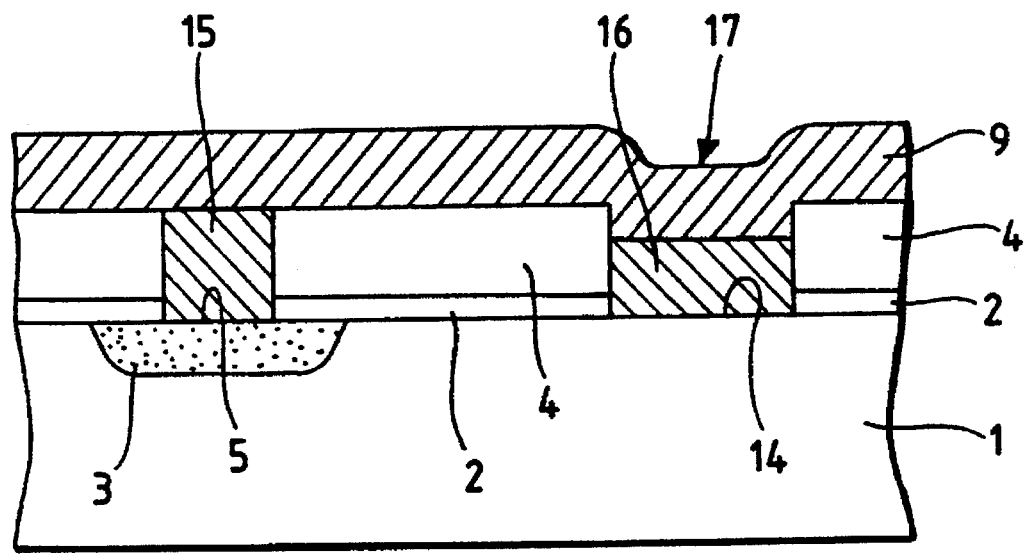
FIG. 6 is a schematic view showing a method for forming an alignment mark according to a third embodiment of the present invention.

FIG. 6 is a schematic cross-sectional view showing another preferred embodiment of the present invention. In this embodiment, different from those shown in FIGS. 3 and 5, the planar area of the stepped mother mark 14 is made sufficiently larger than that of the contact hole 5, in order to utilize the size dependence of the film growth rate in the selective metal deposition in the CVD method to be explained later. More specifically, in selective metal deposition into holes of different sizes, the film growth rate in a smaller hole is higher than that in a larger hole. Consequently the film growth rate in this case is lower in the mother mark 14 than in the contact hole 5.

The producing method for the semiconductor device shown in FIG. 6 will be explained with reference to FIGS. 7A to 7C.

Figure 7A:
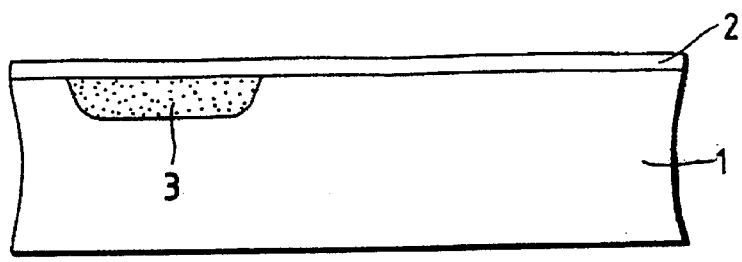
FIGS. 7A to 7C are schematic views showing a method for producing a semiconductor device according to the third embodiment.
Figure 7B:
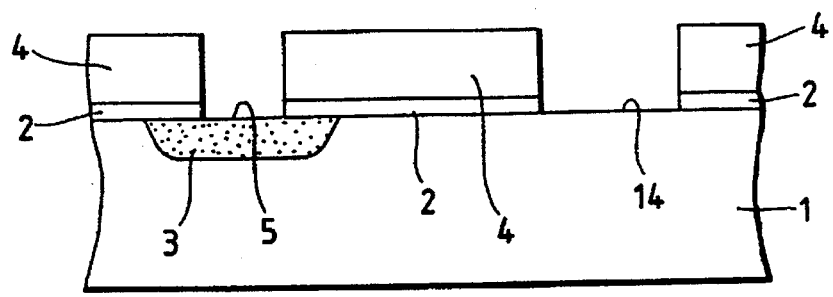

At first a thermal oxide film 2 is formed on the principal surface of the semiconductor substrate 1, and ion implantation with patterned photoresist and thermal treatment are conducted to form a diffusion layer 3 (FIG. 7A). This step is the same as that shown in FIG. 4A. Then an interlayer insulation film 4 is deposited on the thermal oxide film 2 and thermally treated, and a contact hole 5 and a stepped mother mark 14 are formed by contact patterning and etching in such a manner that the mother mark 14 is larger in planar area than the contact hole (FIG. 7B).

Subsequently Al—Si is deposited by selective deposition in the contact hole 5 and the mother mark 14. The deposition is terminated when the upper surface of the conductive wiring layer 15 in the contact hole 5 reaches the level of the upper surface of the interlayer insulation film 4. At this point, because of the above-mentioned size dependence of the selective deposition, the metal film 16 deposited in the mother mark 14 does not reach the upper surface of the interlayer insulation film 4, so that the metal film 16 constitutes a recess to the surrounding insulation film 4 (FIG. 7C).

Thus, at the contact for the electrode, the upper surface of the wiring layer 15 can be planarized with that of the interlayer insulation film 4, while the recessed form of the mother mark 14 can still be utilized as the alignment mark for mask alignment in the patterning of the wiring layer.

Figure 7C:
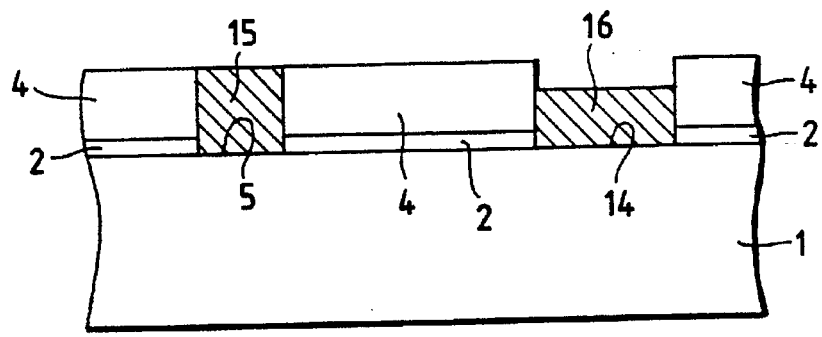

Subsequently the entire surface of the semiconductor substrate 1 shown in FIG. 7C is modified by RF plasma treatment, and is subjected to non-selective deposition of Al—Si by CVD, thereby forming a second wiring layer 9, whereby the recessed form of the mother mark 14 is reflected as a stepped recess 17 in the upper surface of the wiring layer 9 (FIG. 6). In such a semiconductor device, desired wiring patterns could be exactly formed on the semiconductor substrate 1 by a patterning operation of the wiring layer utilizing automask alignment based on irradiation of the recess 17 with a laser beam and detection of the reflected light, in a similar manner as the recess 10 shown in FIG. 3.

As explained in the foregoing, the present invention is capable, based on selective metal deposition by a novel CVD method, of forming a portion faithfully corresponding to the shape of a stepped portion on the upper face of a conductive thin film as a mask alignment mark, whereby a photoresist pattern can be faithfully formed on the substrate surface by auto-alignment in the patterning of a wiring layer.

[Embodiment 4]

Figure 8:
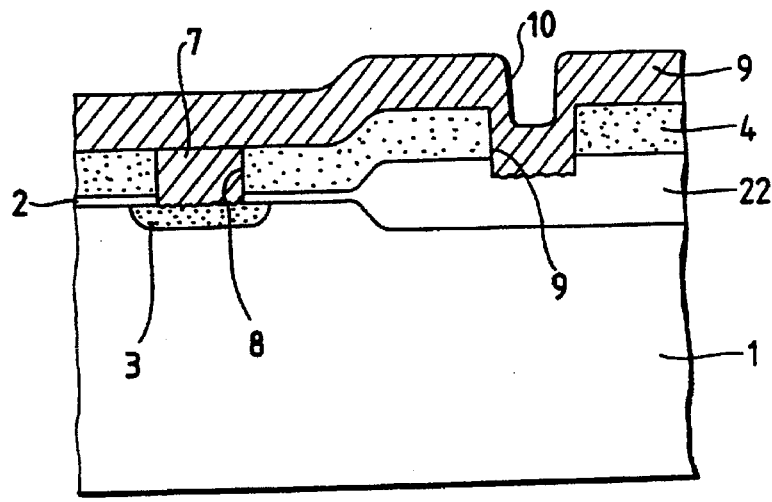
FIG. 8 is a schematic view showing a method for forming an alignment mark according to a fourth embodiment of the present invention.

FIG. 8 shows a preferred embodiment of the present invention, wherein a semiconductor substrate 1 is composed, for example, of silicon and constitutes a conductive substrate on which are formed functional elements, such as MOS or bipolar transistors. In predetermined areas on the principal plane of the substrate 1, there are formed a field oxide film 22 of a larger thickness and a gate oxide film 2 of a smaller thickness. A diffusion layer 3 is provided in the semiconductor substrate 1 under a predetermined area of said gate oxide film 2. An interlayer insulation film 4 is formed with a predetermined thickness on the field oxide film 22 and the gate oxide film 2. Above the diffusion layer 3, a contact hole 8 is formed by opening the gate oxide film 2 and the interlayer insulation film 4 by etching so as to expose the upper surface of the diffusion layer 3. Also in a predetermined area of the interlayer insulation film 4 and the field oxide film 22 thereunder, a stepped mother mark 9 is formed by etching from the upper surface of the interlayer insulation film 4 to the interior of the field oxide film 22.

In the above-mentioned contact hole 8, a first wiring layer 7 as a conductor for electrode extraction is formed by selective deposition for example of aluminum by a special CVD method to be explained later, to the upper surface of the interlayer insulation film 4. Also a second wiring layer 11, composed of a conductive layer, is formed by non-selective deposition of a conductive material on the first wiring layer 7, on the interlayer insulation film 4 and inside the mother mark 9.

In the semiconductor device of such a structure, a recess 10 is formed in the second wiring layer 11 above the mother mark 9, as a stepped portion corresponding to the form of the step in the mother mark 9, and is used as an alignment mark for auto-alignment in the patterning of the second wiring layer 11. In the semiconductor device, since the recess 10 can be formed precisely at the position of the mother mark 9 mentioned above, the wirings can be obtained precisely according to the design, by a patterning operation utilizing the recess 10 as the alignment mark. Since the patterning is not positionally aberrated, high-density wirings are also possible.

The metal to be employed for electrode leads and wirings can be Al, or an alloy principally composed of aluminum such as Al—Si, Al—Cu, Al—Si—Ti or Al—Si—Cu; Cu, Mo or W or an alloy thereof. For filling the contact hole, for electrode extraction, there is preferably employed the Al-CVD method to be explained later. The insulation film is preferably composed of an inorganic material such as silicon oxide or silicon nitride formed by CVD or sputtering, PSG (phosphosilicate glass) or PBSC (borophosphosilicate glass), or an organic material such as polyimide. The wiring layer on the insulation film can be formed for example by forming a metal layer by CVD or sputtering on the entire insulation film followed by patterning of the metal layer into the form of desired wirings by a photolithographic process, or by modifying the desired parts of the insulation film and depositing a metal selectively on thus modified surfacial parts.

The step for the alignment mark is preferably 400 Å or larger, and more preferably 500 Å or larger.

In the following there will be explained the method for producing the semiconductor device shown in FIG. 8, with reference to FIGS. 9A to 9E.

Figure 9A:
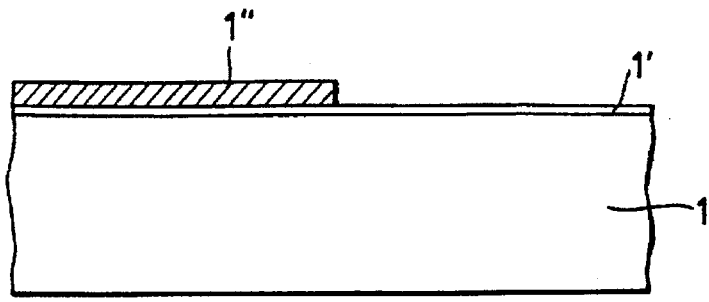
FIGS. 9A to 9E are schematic views showing a method for producing a semiconductor device according to the fourth embodiment.

At first, on a silicon semiconductor substrate 1, constituting a conductive substrate and bearing function elements such as MOS or bipolar transistors thereon, a thermal silicon oxide film 1' was formed by CVD, and, in a predetermined area of the film 1', there was formed a film 1" of high oxidation resistance, such as a silicon nitride film, by CVD (FIG. 9A).

Figure 9B:
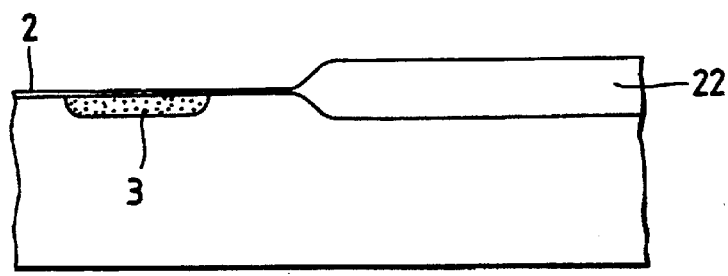
Figure 9C:
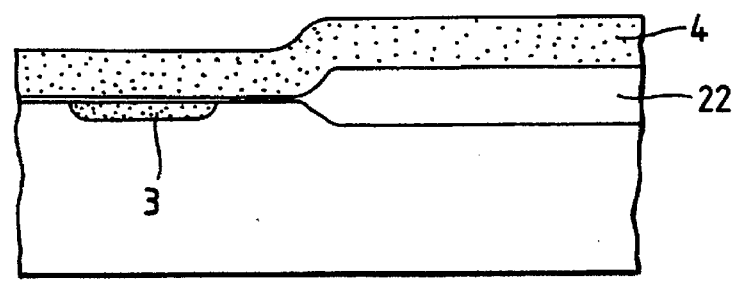

Then selective oxidation was applied to the thermal oxide film 1' and the anti-oxidation film 1" to form a field oxide film 22. Then anti-oxidation film 1" and the thermal oxide film 1' thereunder were removed, and oxidation was again conducted to form a layer 2 constituting the gate oxide film. A polysilicon film (not shown) was deposited in a predetermined area of the gate oxide film 2, and ion implantation through a photoresist pattern, followed by thermal treatment, was conducted to form a diffusion layer 3 (FIG. 9B). Subsequently an interlayer insulation film 4 was formed by CVD over the entire surface of the semiconductor substrate 1 (FIG. 9C). The interlayer insulation film 4 was provided for electrical separation of the above-mentioned polysilicon film from an Al-CVD film to be explained later.

Figure 9D:
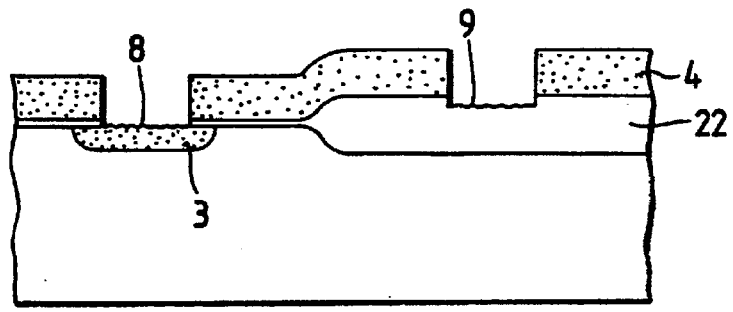

Then, the interlayer insulation film 4 was subjected to a patterning process to form a contact hole 8 for electrode extraction, exposing the diffusion layer 3 therein and a mother mark 9 as a step reaching the interior of the field oxide film 22 (FIG. 9D).

Figure 9E:
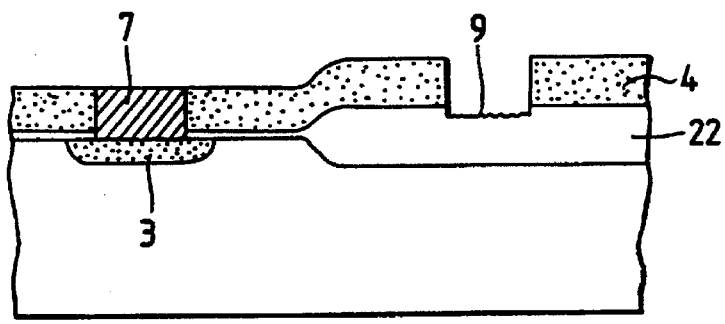

Subsequently Al—Si was selectively deposited in the contact hole 8 by the aforementioned selective deposing method to form a conductive first wiring layer 7 until the upper face thereof reaches the upper surface of the interlayer insulation film 4 (FIG. 9E).

Then the entire surface of the semiconductor substrate 1, namely the surface of the first wiring layer 7 and of the interlayer insulation film 4 and the interior of the mother mark 9, was subjected to RF plasma treatment and then to non-selective Al—Si deposition for example by sputtering, and the Al—Si layer was patterned to form a second wiring layer 11 (cf. FIG. 8). As a result, the recessed form of the stepped mother mark 9 was transferred as a recess 10 on the upper surface of the second wiring layer 11. A desired wiring pattern could be exactly formed on the semiconductor Substrate 1 by patterning the second wiring layer 11 with automatic mask alignment utilizing irradiation of the recess 10 with a laser beam and detection of the reflected light.

In the above-explained embodiment, prior to the formation of the second wiring layer 11 on the interlayer insulation film 4, the surface thereof may be planarized by a SOG (spin-on-glass) method. More specifically a solution of silanol compound in organic solvent (alcohol or ketone) is spin coated with a spin coater for 15–30 seconds at a revolution of 3,000–6,000 rpm, with a back rinse with isopropyl alcohol, and the semiconductor substrate is baked on a hot plate for 1–3 minutes at 80°–200° C. The surface irregularities of the interlayer insulation film are almost eliminated by such a process, so that the second wiring layer becomes free from an increase in resistance or breakage at steps, resulting from such surface irregularities.

[Embodiment 5]

Figure 10:
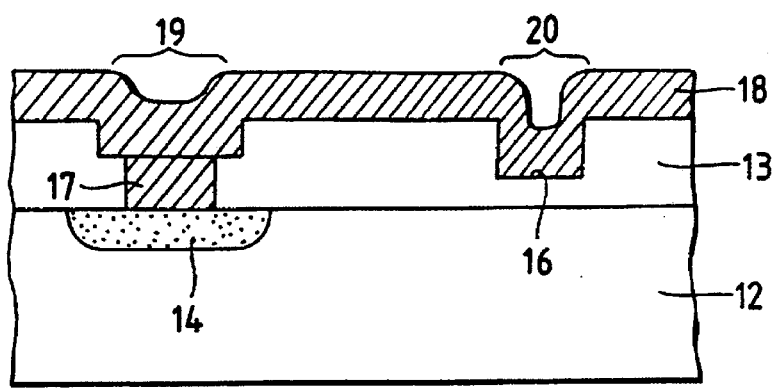
FIG. 10 is a schematic view showing a method for forming an alignment mark according to a fifth embodiment of the present invention.

FIG. 10 is a schematic cross-sectional view showing another preferred embodiment of the present invention. On the principal surface of a semiconductor substrate 12 composed for example of silicon and bearing functional elements such as bipolar transistors thereon, there is formed an oxide film 13, and a diffusion layer 14 is formed in the substrate 12 under a predetermined area of the oxide film 13. Above the diffusion layer 14 there is formed a contact hole 15 for example by etching the oxide film 13 so as to expose the upper surface of the diffusion layer 14. The contact hole 15 is composed of a lower part 15a having a smaller planar area and having the bottom on the upper face of the diffusion layer 14, and an upper part 15b of a larger planar area having the bottom at the upper end of the lower part 15a. Also in a predetermined area of the oxide film 13, a mother mark 16 is formed as a step obtained by etching said oxide film 13 from the upper surface to the interior thereof.

In the lower part 15a of the contact hole 15, there is formed a first wiring layer 17 for electrode extraction, obtained by selective deposition of a conductive material such as aluminum by the aforementioned selective depositing method to the upper end of the lower part 15a. Also a second wiring layer 18, obtained by non-selective deposition of a conductive material, is formed on the first wiring layer 17 and on the oxide film 13, and in the mother mark 16. The second wiring layer 18 is provided thereon with a recess 19 above the contact hole 15 and another recess 20 above the mother mark 16. Thus the recess 20, formed as a step corresponding tn shape to the mother mark 16, can be used as an alignment mark for automatic mask alignment in the patterning of the wiring layer.

Figure 11A:
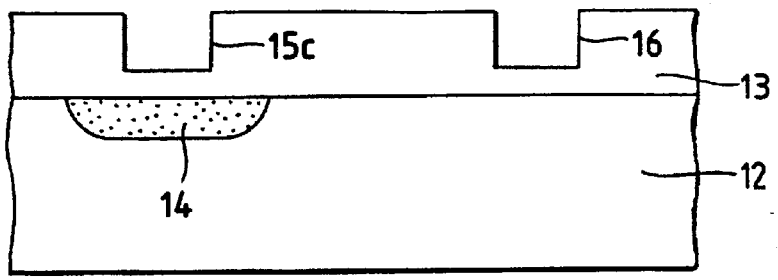
FIGS. 11A to 11C are schematic views showing a method for producing a semiconductor device according to the fifth embodiment.
Figure 11B:
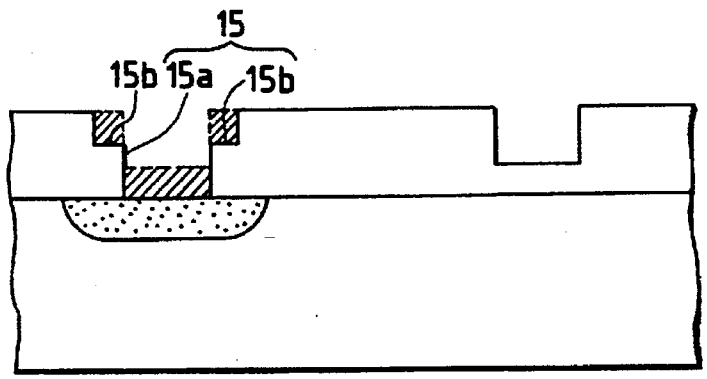
Figure 11C:
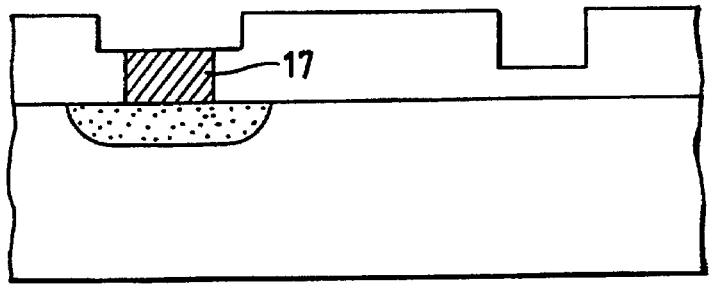

Now reference is made to FIGS. 11A to 11C for explaining the producing method of the semiconductor device shown in FIG. 10.

A thermal oxide film 13 is formed on the principal surface of a semiconductor substrate 12. Then a photoresist pattern is applied to a predetermined area of the oxide film 13, and ion implantation followed by thermal treatment is conducted to form a diffusion layer 14. Then a first contact patterning is applied to the oxide film 13 to form a shallow aperture 15c in a predetermined area of the oxide film 13 above the diffusion layer 14, and simultaneously a recess 16 of the same depth in a predetermined area of the oxide film 13 (FIG. 11A).

Then, a second patterning is applied to the oxide film 13 to etch the bottom of the aperture 15c so as to expose the diffusion layer 14, thereby forming the lower part 15a of the contact hole 15. At the same time the periphery of the aperture 15c is etched to form the upper part 15b of the contact hole 15 (FIG. 11B).

Subsequently Al—Si is selectively deposited in the lower part 15a of the contact hole 15 by the aforementioned selective depositing method to form a conductive first wiring layer 17 to the level of the bottom of the upper part 15b (FIG. 11C).

Then, the entire surface of the semiconductor substrate 12, namely the surface of the oxide film 13 and of the first wiring layer 17 in the contact hole 15 and the interior of the mother mark 16, are subjected to RF plasma treatment, and then to non-selective deposition of Al—Si for example by sputtering, followed by patterning to obtain a conductive second wiring layer 18 (FIG. 10). As a result, a stepped recess 20 is formed on the second wiring layer 16, corresponding to the form of the stepped mother mark 16.

Thus, a desired wiring pattern could be exactly formed of the semiconductor substrate 12 in the patterning of the second wiring layer 16, by automatic mask alignment utilizing irradiation of the recess 20 with a laser beam and detection of the reflected light.

In the embodiments 4 and 5 explained above, the selective metal deposition by a novel CVD method allows the formation of a conductor by depositing a conductive material selectively in an aperture in which the conductive substrate is exposed. Thus, by non-selective deposition of a conductive material on the conductor and on a step formed in an insulation film provided on the substrate surface, there can be formed a portion, in the thus obtained conductor layer, corresponding in shape to the step. The portion can be utilized as a mask alignment mark in the patterning of the conductor layer, thereby allowing the obtaining of a faithful wiring pattern of desired shape, for example, by auto-alignment.

In the following there will be explained a film forming method adapted for use in the foregoing embodiments 1 to 5, for forming the wiring layer.

The film forming method is suitable for filling an aperture with a conductive material for the purpose of forming an electrode of the above-explained structure, and its depositing speed is dependent on the area of substrate in the aperture.

More specifically, the film forming method suitable for use tn the present invention is to form a deposition film on an electron-donating substrate by a surface reaction, utilizing alkylaluminum hydride gas and hydrogen gas (said method being hereinafter called Al-CVD method).

An aluminum film of particularly satisfactory quality can be obtained by employing monomethylaluminum hydride (MMAH) or dimethylaluminum hydride (DMAH) as the raw material gas and hydrogen gas as the reaction gas, and heating the substrate surface in the presence of a mixture of these gasses. In the selective aluminum deposition, the substrate surface is preferably maintained, by direct or indirect heating, at a temperature at least equal to the decomposition temperature of alkylaluminum hydride but not exceeding 450° C., more preferably from 260° to 440° C.

The substrate can be heated to the above-mentioned temperature range by direct or indirect heating, but aluminum film of satisfactory quality can be obtained by maintaining the substrate in the temperature range by direct heating. For example, when the substrate surface temperature is maintained in the more preferred range of 260°–440° C., a satisfactory aluminum film can be obtained with a deposition speed of 3000–5000 Å/min., which is higher than that obtainable with resistance heating. Such direct heating, in which the substrate itself is heated by direct energy transfer from heating means, can be achieved by heating with a lamp, such as a halogen lamp or a xenon lamp. Also indirect heating can be achieved by resistance heating, for example by a heating resistor provided in a support member for supporting the substrate in a film forming chamber.

The above-mentioned method, when applied to a substrate having both an electron-donating surface area and an electron non-donating surface area, forms an aluminum single crystal with satisfactory selectivity, solely on the electron-donating surface area. The aluminum is excellent in all the properties required for an electrode/wiring material, including a reduced frequency of hillocks and a reduced frequency of formation of alloy spikes.

This is presumably because of the fact that aluminum of satisfactory quality can be selectively formed on a conductive or semiconductive surface constituting an electron-donating surface and that the aluminum, excellent in crystalline character, scarcely shows formation of alloy spikes resulting from eutectic reactions with the underlying material, such as silicon. The aluminum, when employed as an electrode in the semiconductor device, shows advantages not anticipated in the prior technology and beyond the concept of the conventional aluminum electrode.

As explained in the foregoing, this method provides a monocrystalline structure in the aluminum deposited in an aperture formed for example in an insulation film and exposing therein an electron-donating surface such as a semiconductive substrate surface, but this Al-CVD method can also deposit selectively metal films principally composed of aluminum with satisfactory film quality, as will be explained in the following.

For example a conductive material such as Al—Si, Al—Ti, Al—Cu, Al—Si—Ti or Al—Si—Cu can be deposited by introducing, in addition to alkylaluminum hydride gas and hydrogen:

Si-containing gas such as $SiH_4$, $Si_2H_6$, $Si_3H_8$, $Si(CH_3)_4$, $SiCl_4$, $SiH_2Cl_2$ or $SiHCl_3$;

Ti-Containing gas such as $TiCl_4$, $TiBr_4$ or $Ti(CH_3)_4$; and

Cu-containing gas such as copper bisacetylacetonate (Cu (Cu(C$_5$H$_7$O$_2$)), copper bisdipivaloylmethanite (Cu (C$_{11}$H$_{19}$O$_2$)$_2$) or copper bishexafluoroacetylacetonate (Cu(C$_5$HF$_6$O$_2$)$_2$); in suitable combination, as a gaseous mixture.

Also since the Al-CVD method is capable of selective film formation and providing satisfactory surface characteristics in the deposited film, there may be employed a non-selective film forming method in a next step to form an aluminum film or a metal film principally composed of aluminum, on the selectively deposited aluminum film and on an insulation film composed, for example, of SiO$_2$, thereby obtaining a metal film widely usable for wirings of the semiconductor device.

Examples of such a metal film include combinations of selectively deposited Al, Al—Si, Al—Ti, Al—Cu, Al—Si—Ti or Al—Si—Cu and non-selectively deposited Al, Al—Si, Al—Ti, Al—Cu, Al—Si—Ti or Al—Si—Cu.

The non-selective film deposition can be achieved, for example, by a CVD method other than the Al-CVD method or by sputtering.

[Film forming apparatus]

In the following there will be described a film forming apparatus adapted for use in electrode formation according to the present invention.

Figure 12:
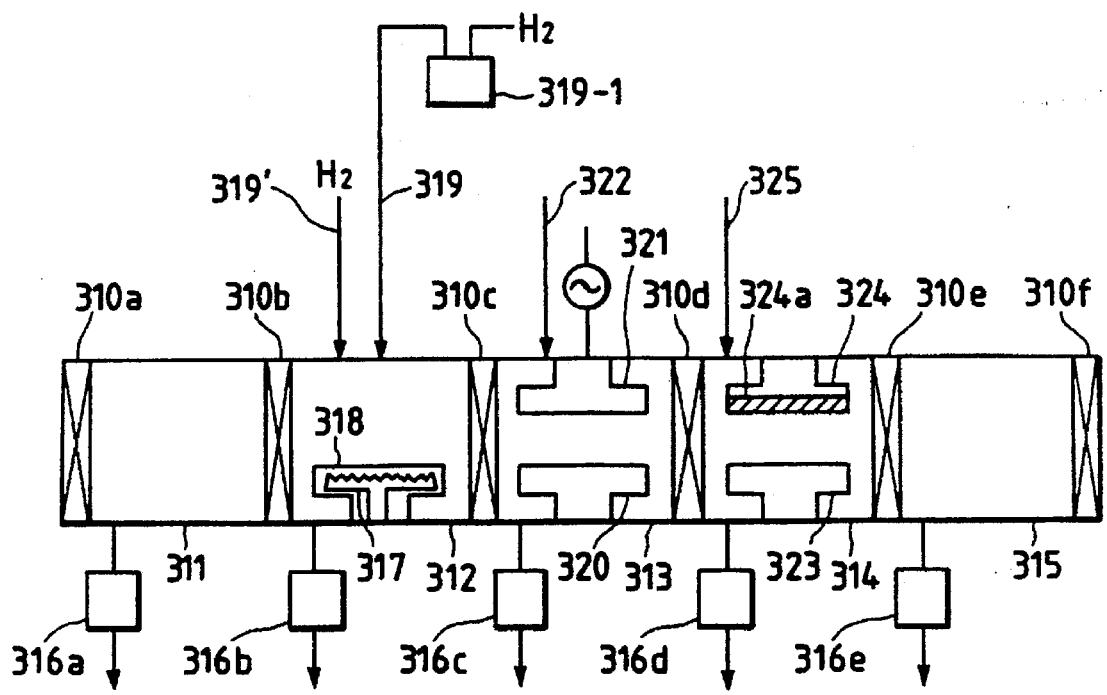
FIGS. 12 to 15 are views showing an example of the manufacturing apparatus adapted for use in the method of the present invention.
Figure 13:
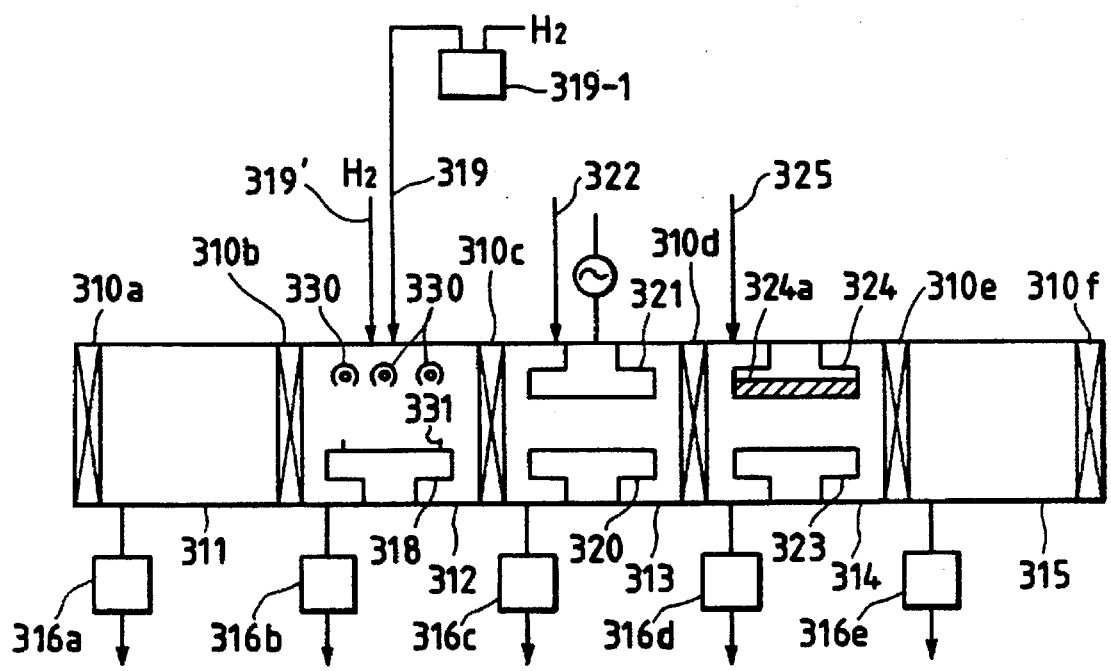
Figure 14:
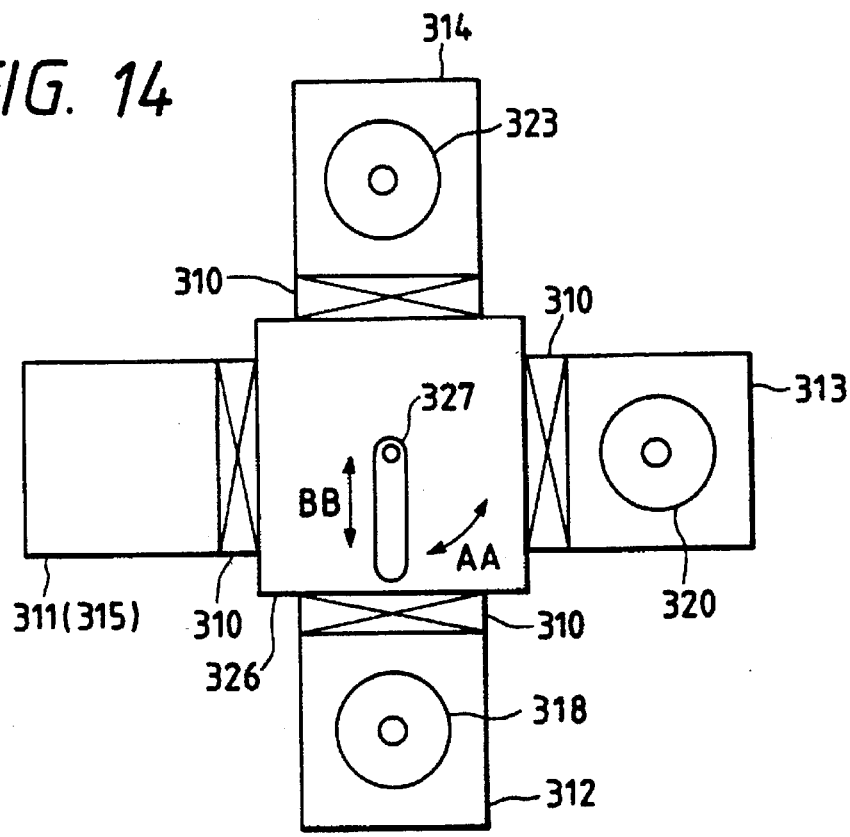
Figure 15:
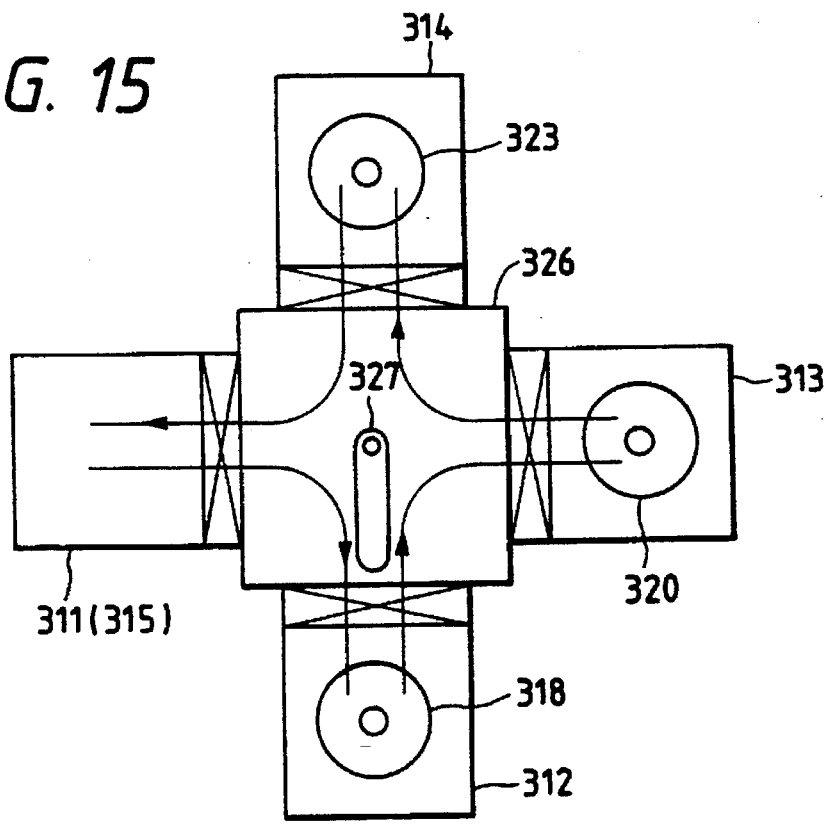

FIGS. 12 to 14 illustrate a continuous metal film forming apparatus adapted for use in the film forming method explained above.

The continuous film forming apparatus consists, as shown in FIG. 12, of a loading chamber 311, a CVD reaction chamber 312 serving as a first film forming chamber, an Rf etching chamber 313, a sputtering chamber 314 serving as a second film forming chamber, and an unloading chamber 315, which can mutually communicate by gate valves 310a–310f in a sealed state from the external atmosphere and can be independently evacuated by vacuum systems 316a–316e. The loading chamber 311 is provided to replace the atmosphere of the substrate prior to deposition with hydrogen gas, in order to increase the throughput. The next CVD reaction chamber 312 conducts the selective deposition by the aforementioned Al-CVD method onto the substrate under an ordinary or low pressure, is provided therein with a substrate holder 318 equipped with a heating resistor 317 for heating the substrate surface to be subjected to the film deposition at least within a temperature range of 200°–450° C., and is further provided with a raw material gas line 319 for introducing raw material gas such as alkylaluminum hydride gasified by bubbling with hydrogen gas in a bubbler 319-1 and another gas line 319' for introducing hydrogen gas as the reaction gas. The Rf etching chamber 313, for cleaning (etching) the substrate surface after selective deposition in argon atmosphere, is provided therein with a substrate holder 320 capable of heating the substrate at least within a temperature range of 100°–250° C. and an RF etching electrode line 321, and is further provided with an argon gas supply line 322. The sputtering chamber 314, for non-selective deposition of a metal film by sputtering onto the substrate surface in an argon atmosphere, is equipped therein with a substrate holder 323 for heating the substrate at least within a range of 200°–250° C. and a target electrode 324 for supporting a sputtering target 324a, and is also provided with an argon gas supply line 325. The final unloading chamber 315, for adjustment of the substrate after metal film deposition before the transfer of the substrate to the exterior, is capable of replacing the atmosphere with nitrogen.

FIG. 13 shows another structure of the continuous metal film forming apparatus suitable for use in the above-explained film forming method, wherein the same components as those in FIG. 12 are represented by same numbers. The apparatus in FIG. 13 is different from that in FIG. 12 in that the substrate surface can be directly heated by halogen lamps 330 constituting direct heating means, and in that the substrate holder 312 is provided with projections 331 for supporting the substrate in a floating state for such direct heating.

The direct heating of the substrate surface with such structure allows the obtaining of an increased deposition speed, as explained already in the foregoing.

The continuous metal film forming apparatus of the above-explained structure is in practice equivalent to a structure shown in FIG. 14, in which the loading chamber 311, CVD reaction chamber 312, Rf etching chamber 313, sputtering chamber 314 and unloading chamber 315 are mutually linked through a transfer chamber 326, wherein the loading chamber 311 also serves as the unloading chamber 315. The transfer chamber 326 is provided, as shown in FIG. 14, with an arm 327 which can rotate in both directions AA and telescope in directions BB and can transfer the substrate in succession from the loading chamber 311 through the CVD reaction chamber 312, Rf etching chamber 313, and the sputtering chamber 314 to the unloading chamber 315 without exposure to the external atmosphere.

[Film forming procedure]

In the following there will be described the film forming procedure for forming electrodes and wirings according to the present invention.

FIGS. 16A to 16D are schematic perspective views showing the steps of the film forming procedure.

At first described is the outline of the procedure. A semiconductor substrate bearing an insulation film with an aperture in the film is maintained at a surface temperature for example of 260°–450° C. in the film forming chamber, and aluminum is selectively deposited on the semiconductor exposed in the aperture by a thermal CVD method in a mixed atmosphere of alkylaluminum hydride gas such as DMAH and hydrogen gas. Naturally there may be deposited selectively a metal film principally composed of aluminum, such as Al—Si, by introduction of Si-containing gas, as explained before. Then, on the selectively deposited aluminum film and on the insulation film, a metal film composed solely or principally of aluminum is non-selectively deposited by sputtering. Subsequently, the non-selectively deposited metal film is patterned into a desired shape to obtain the electrodes and wirings.

In the following the procedure will be explained in greater detail with reference to FIGS. 13 and 16A–16D. The substrate employed is, for example, a monocrystalline silicon wafer with an insulation film thereon, having apertures of different sizes therein.

Figure 16A:
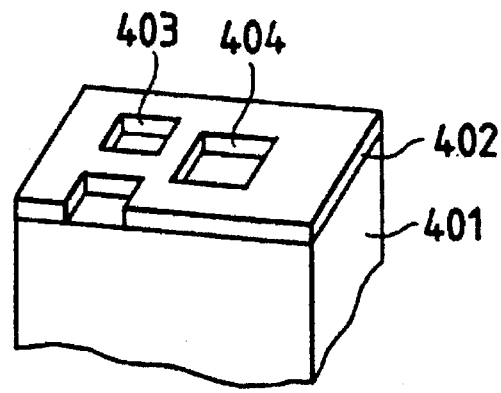
FIGS. 16A to 16D are schematic perspective views showing the steps of wiring layer formation according to the method of the present invention.

FIG. 16A schematically illustrates a part of the substrate, wherein shown are a monocrystalline silicon substrate 401 constituting a conductive substrate; a thermal silicon oxide film 402 constituting an insulation film; and apertures 403, 404 of different sizes.

The aluminum film formation, for forming an electrode in the first wiring layer, is conducted in the following manner, with an apparatus shown in FIG. 13.

At first the above-mentioned substrate is placed in the loading chamber 311, in which hydrogen is introduced to establish a hydrogen atmosphere, as explained before. The CVD reaction chamber 312 is evacuated by the vacuum system 316b to a pressure of ca. $1 \times 10^{-8}$ Torr. However the aluminum film formation is possible at a pressure higher than $1 \times 10^{-8}$ Torr.

Then DMAH gas obtained by bubbling is supplied from the gas line 319, utilizing H$_2$ as carrier gas.

Also $H_2$ as the reaction gas is supplied from the second gas line 319', and the reaction chamber 312 is maintained at a predetermined pressure, by regulating the aperture of an unrepresented slow-leak valve. A typical total pressure is about 1.5 Torr, with a DMAH partial pressure of ca. $5.0 \times 10^{-3}$ Torr. Then, the halogen lamps 330 are turned on to directly heat the wafer, and selective deposition of aluminum is thus conducted.

The DMAH supply is terminated after the lapse of a predetermined deposition time. The deposition time is a time required by the aluminum film on Si (silicon substrate 1) to reach the thickness of SiO (thermal oxide film 2) and can be experimentally determined in advance.

Figure 16B:
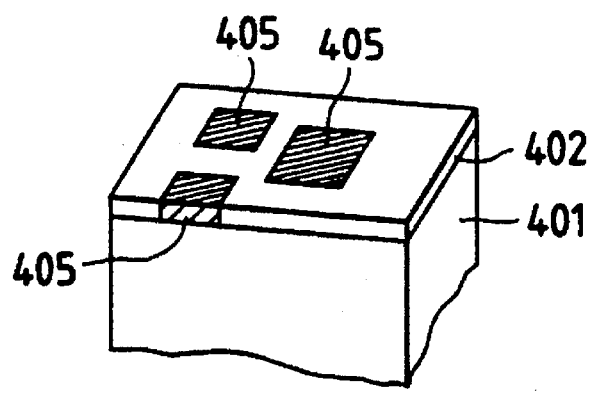

The substrate surface temperature is maintained at about 270° C. by direct heating. By the above-explained steps, an Al film 405 is selectively deposited in the apertures as shown in FIG. 16B.

The above-mentioned steps are called a first film forming step for electrode formation in the contact hole.

Subsequently, the CVD reaction chamber 312 is evacuated by the vacuum system 316b to a pressure of $5 \times 10^{-3}$ Torr or lower, and the Rf etching chamber 313 is simultaneously evacuated to a pressure of $5 \times 10^{-6}$ Torr or lower. After the chambers reach the above-mentioned pressures, the substrate is transferred from the CVD reaction chamber 312 to the Rf etching chamber 313 by the transfer means, by opening the gate valve 310c, and the gate valve 310c is subsequently closed. The Rf etching chamber 313 is evacuated by the vacuum system 316c to a pressure of $10^{-6}$ Torr or lower, and is then maintained in an argon atmosphere of $10^{-1}$–$10^{-3}$ Torr by an argon supply from the argon supply line 322. The substrate holder 320 for Rf etching is maintained at ca. 200° C., and an RF power of 100 W is supplied for about 60 seconds to the Rf etching electrode 321, thereby inducing an argon discharge in the Rf etching chamber 313 and eliminating an unnecessary surface layer of the CVD deposition film by etching with argon ions. The etch depth in this case is about 100 Å calculated by oxide. The Rf etching of the surface of the CVD film in the RF etching chamber may however be dispensed with, since the surfacial layer of the CVD film, being transported in the vacuum, is free from oxygen, etc., from the air. In such case, the Rf etching chamber 313 serves for a rapid temperature change if there is a large temperature difference between the CVD reaction chamber 312 and the Sputtering chamber 314.

After the completion of Rf etching, the argon supply is terminated, and the Rf etching chamber 313 is evacuated to $5 \times 10^{-6}$ Torr. Then, after the sputtering chamber 314 is evacuated to $5 \times 10^{-6}$ Torr or lower, the gate valve 310d is opened, then the substrate is transferred from the Rf etching chamber 313 to the sputtering chamber 314 by the transfer means, and the gate valve 310d is closed.

Subsequently the sputtering chamber 314 is maintained in an argon atmosphere of $10^{-1}$–$10^{-3}$ Torr as in the Rf etching chamber 313, and the substrate holder 323 is maintained at 200°–250° C. An argon discharge is inducted with a DC power of 5–10 KW to scrape the target of Al or Al—Si (Si: 0.5%) with argon ions, thereby depositing Al or Al—Si non-selectively onto the substrate with a deposition speed of ca. 10000 Å/min. This step is called a second film forming step for forming a wiring to be connected with the electrode.

After the formation of a metal film of about 5000 Å on the substrate, the supply of argon and DC power is terminated. The unloading chamber is evacuated to $5 \times 10^{-3}$ Torr or lower, the substrate is transferred thereto by opening the gate valve 310e. After the gate valve is closed, nitrogen gas is introduced into the unloading chamber 311 to the atmospheric pressure, and the substrate is taken out by opening the gate valve 310f.

Figure 16C:
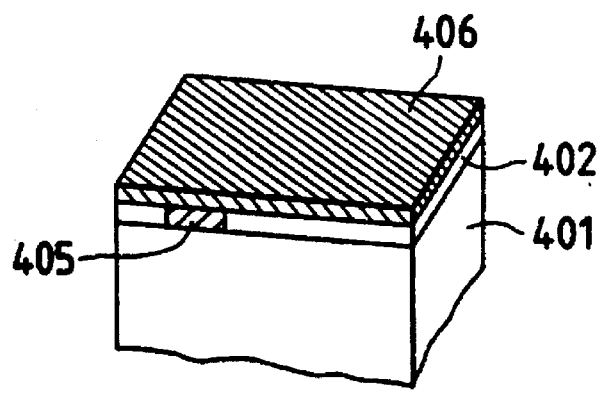

The above-explained second film forming step forms an Al film 406 on the $SiO_2$ film 402 as shown in FIG. 16C.

Figure 16D:
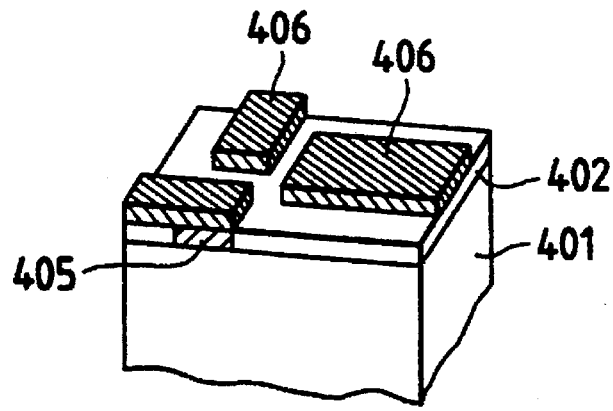

Wirings of a desired form can be obtained by patterning the Al film 406 as shown in FIG. 16D.

[Experimental results]

In the following there will be given experimental results showing the superiority of the Al-CVD process and of the quality of the aluminum film deposited in the aperture.

There were employed plural substrates (sample 1-1) consisting of monocrystalline n-silicon wafers, bearing a thermally oxidized surfacial $SiO_2$ layer of a thickness of 8000 Å, in which apertures of different sizes from 0.25×0.25 to 100×100 μm were patterned to expose the underlying monocrystalline silicon therein.

These samples were subjected to aluminum film formation by the Al-CVD method, employing DMAH as the raw material gas and $H_2$ as the reaction gas with a total pressure of 1.5 Torr and a DMAH partial pressure of $5.0 \times 10^{-3}$ Torr, and with a regulated power to the halogen lamps to obtain the substrate surface temperature within a range of 200°–490° C. by direct heating. The obtained results are summarized in Table. 1.

TABLE 1

| Substrate surface temp. (°C.) | 200 | 230 | 250 | 260 | 270 | 280 | 300 | 350 | 400 | 440 | 450 | 460 | 470 | 480 | 490 |
|---|---|---|---|---|---|---|---|---|---|---|---|---|---|---|---|
| Deposition speed (Å/min.) | ← 1000–1500 → | | | | | | ← 3000–5000 → | | | | | | | | |
| Throughput (wafer/hr) | ← 7–10 → | | | | | | ← 15–30 → | | | | | | | | |
| Si linear defects | | | | | | | ← not observed → | | | | | | | | |
| Carbon content | | | | | | | ← not detected → | | | | | | | | |
| Resistivity (μΩcm) | ← 2.7–3.3 → | | | | | | ← 2.8–3.4 → | | | | | | | | |
| Reflectance (%) | ← 85–95 → | | | | | | ← 90–95 → | | | | | ← ca. 60 → | | | |
| Hillock (>1 μm) density ($cm^{-2}$) | ← 1–$10^2$ → | | | | | | ← 0–10 → | | | | | ← 10–$10^4$ → | | | |
| Spike formation (%) destruction frequency of 0.15 μm junction) | | | | | ← 0 → | | | | | | | ← 0–30 → | | | |

As will be apparent from Table 1, aluminum could be deposited selectively with a deposition speed as high as 3000–5000 Å/min. at a substrate surface temperature of 260° C. or higher, obtained by direct heating.

The aluminum film obtained in the aperture within a substrate surface temperature range of 260°–440° C. showed satisfactory characteristics with no carbon content, a resistivity of 2.8–3.4 μΩcm, a reflectance of 90–95%, a density of hillocks at least equal to 1.0 μm within a range of 0–10, and almost no spike formation (represented by frequency of destruction of junctions of 0.15 μm).

On the other hand, within a substrate surface temperature range of 200°–250° C., the film quality is considerably superior to that in the prior technology though it is somewhat inferior to that in the temperature range of 260°–440° C., but the deposition speed could not exceed 1000–1500 Å/min. and the throughput was in a relatively low range of 7–10 wafers/hr.

Also at a substrate surface temperature equal to or higher than 450° C., the quality of the aluminum film in the aperture deteriorated, with a reflectance of 60% or lower, a density of hillocks of at least. 1 m within a range of 10–10$^4$ cm$^{-2}$ and a frequency of alloy spike formation of 0–30%.

In the following there will be explained how the above-explained method can be favorably applied to an aperture such as a contact hole or a through-hole.

The above-explained method can be favorably applied to a contact hole or through-hole structure of the following materials.

The following samples were subjected to aluminum film formation under the same conditions as those employed for the sample 1-1.

A sample 1-2 was prepared by forming, on monocrystalline silicon constituting a first substrate surface material, a silicon oxide film of a thickness of 8000 Å by CVD as a second substrate surface material, and patterning the silicon oxide film by a photolithographic process to form apertures of different sizes from 0.25×0.25 to 100×100 μm, thereby localling exposing the monocrystalline silicon surface therein (the sample being hereinafter represented as "VD SiO$_2$" (or simply SiO$_2$ (or simply SiO$_2$)/monocrystalline silicon).

Also there were prepared:
a sample 1-3 of a boron-doped oxide film obtained by normal pressure CVD (hereinafter BSG)/monocrystalline silicon;
a sample 1-4 of a phosphor-doped oxide film obtained by normal pressure CVD (hereinafter PSG)/monocrystalline silicon;
a sample 1-5 of phosphor- and boron-doped oxide film obtained by normal pressure CVD (hereinafter BSPG) /monocrystalline silicon;
a sample 1-6 of a nitride film obtained by plasma CVD (hereinafter P-SiN)/monocrystalline silicon;
a sample 1-7 of a thermal nitride film (T-SiN)/ monocrystalline silicon;
a sample 1-8 of a nitride film obtained by low pressure CVD (LP-SiN)/monocrystalline silicone;
a sample 1-9 of a nitride film obtained by ECR (ECR-SiN/monocrystalline silicon.

Furthermore there were prepared samples 1-11 to 1-179 (sample numbers 1-10, 20, 30, 40, 50, 60, 70, 80, 90, 100, 110, 120, 130, 140, 150, 160 and 170 are lacking) by taking all the combinations of following first substrate surface materials of 18 kinds and second substrate surface materials of 9 kinds. The first substrate surface materials employed were monocrystalline silicon (mono-Si), polycrystalline silicon (poly-Si), amorphous silicon (a-Si), tungsten (W), molybdenum (Mo), tantalum (Ta), tungsten silicide (WSi), titanium silicide (TiSi), aluminum (Al), aluminum-silicon (Al—Si), titanium-aluminum (Al—Ti), titanium nitride (Ti—N), copper (Cu), aluminum-silicon-copper (Al—Si—Cu), aluminum-palladium (Al—Pd), titanium (Ti), molybedenum silicide (Mo—Si), and tantalum silicide (Ta—Si). Also the second substrate surface materials employed were T-SiO$_2$, SiO$_2$, BSG, PSG, BPSG, P-SiN, T-Sin, LP-SiN, and ECR-SiN. In all these samples, there could be obtained aluminum films comparable in quality to that on the aforementioned sample 1-1.

Then an aluminum film Was non-selectively deposited by sputtering on the substrates subjected to selective aluminum deposition as explained above and was patterned.

The aluminum film obtained by the sputtering and the selectively deposited aluminum film in the aperture showed satisfactory contact with high electrical and mechanical durability, because of the excellent surface state of the latter aluminum film in the aperture.

We claim:

1. A method of producing an alignment mark which method comprises the steps of:
   providing a semiconductor substrate having at its surface an insulating layer with a contact hole and a further aperture formed therein;
   depositing a conductive material selectively to fill the contact hole and at least partially to fill the further aperture; and
   depositing wiring material on said insulating layer, on said conductive material filling the contact hole, and on conductive material at least partially filling the further aperture, so that an alignment mark is produced over the at least partially filled further aperture,
   wherein said further aperture exposes an area of the substrate larger than the area of the substrate exposed by said contact hole, and
   said depositing of conductive material step is performed by selective chemical vapor deposition using an alkylaluminium hydride and partially fills the further aperture.

2. A method according to claim 1, wherein the alkylaluminium hydride is dimethylaluminum hydride.

3. A method according to claim 1, wherein at least one of a Si-, Ti-, or Cu-containing gas is mixed with the alkylaluminium hydride and hydrogen to deposit selectively Al—Si, Al—Ti, Al—Cu, Al—Si—Ti, or Al—Si—Cu as the selectively deposited conductive material.

4. A method according to claim 2, wherein at least one of a Si-, Ti-, or Cu-containing gas is mixed with the alkylaluminium hydride and hydrogen to deposit selectively Al—Si, Al—Ti, Al—Cu, Al—Si—Ti, or Al—Si—Cu as the selectively deposited conductive material.

5. A method of producing a wired semiconductor device using an alignment mark for wire pattern alignment, comprising the steps of:
   providing a semiconductor substrate having at its surface an insulating layer with a contact hole and a further aperture formed therein;
   depositing a conductive material selectively to fill the contact hole and at least partially to fill the further aperture;
   depositing wiring material on said insulating layer, on said conductive material filling the contact hole, and on said conductive material at least partially filling the further aperture so that an alignment mark is produced over the at least partially filled further aperture,
   wherein said further aperture exposes an area of the substrate larger than the area of the substrate exposed by said contact hole, and
   said depositing of conductive material step is performed by selective chemical vapor deposition using an alkylaluminium hydride and partially fills the further aperture; and patterning the wiring material using the alignment mark for pattern alignment.

6. A method according to claim 5, wherein the alkylaluminium hydride is dimethylaluminum hydride.

7. A method according to claim 5, wherein at least one of a Si-, Ti-, or Cu-containing gas is mixed with the alkylaluminium hydride and hydrogen to deposit selectively Al—Si, Al—Ti, Al—Cu, Al—Si—Ti, or Al—Si—Cu as the selectively deposited conductive material.

8. A method according to claim 5, wherein automatic pattern alignment is performed using laser light reflected from the alignment mark.

* * * * *

UNITED STATES PATENT AND TRADEMARK OFFICE
CERTIFICATE OF CORRECTION

PATENT NO. : 5,663,099  Page 1 of 4
DATED : September 2, 1997
INVENTOR(S) : TAKAHIKO OKABE It is certified that error appears in the above-identified patent and that said Letters Patent is hereby corrected as shown below:

ON THE COVER PAGE

AT [56], Foreign Patent Documents

"212219 7/1986 European Pat. Off." should read --212219 3/1987 European Pat. Off.--.

"230113 1/1990 Japan" should read --2-30113 1/1990 Japan--.

"250414 2/1990 Japan" should read --2-50414 2/1990 Japan--.

AT [56], OTHER PUBLICATIONS

"Multilevel Metal Direct Writer Resignation" should read --Multilevel Metal Direct Write Registration--.

"Research Disclosure No. 30327 Alignment" should read --Research Disclosure No. 30327 Alignment Aid--.

SHEET 4 OF DRAWINGS

In Figure 8, add reference numeral 11 and a lead line therefrom to the layer above layer 7.

COLUMN 4

Line 20, "0n" should read --On--.

UNITED STATES PATENT AND TRADEMARK OFFICE
CERTIFICATE OF CORRECTION

PATENT NO. : 5,663,099  Page 2 of 4
DATED : September 2, 1997
INVENTOR(S) : TAKAHIKO OKABE It is certified that error appears in the above-identified patent and that said Letters Patent is hereby corrected as shown below:

COLUMN 5

Line 1, "following" should read --following,--.
　　　Line 11, "Subsequently" should read --Subsequently,--.
　　　Line 14, "Subsequently" should read --Subsequently,--.

COLUMN 6

Line 11, "quently" should read --quently,--.

COLUMN 8

Line 32, "Substrate" should read --substrate--.
　　　Line 37, "film 4,.the" should read --film 4, the--.
　　　Line 38, "specifically" should read --specifically,--.

COLUMN 9

Line 10, "tn" should read --in--.
　　　Line 63, "following" should read --following,--.

COLUMN 10

Line 5, "tn" should read --in--.
　　　Line 30, "Also" should read --Also,--.

UNITED STATES PATENT AND TRADEMARK OFFICE
CERTIFICATE OF CORRECTION

PATENT NO. : 5,663,099  Page 3 of 4
DATED : September 2, 1997
INVENTOR(S) : TAKAHIKO OKABE It is certified that error appears in the above-identified patent and that said Letters Patent is hereby corrected as shown below:

COLUMN 11

Line 6, "Also" should read --Also,--.
Line 22, "following" should read --following,--.

COLUMN 12

Line 46, "following" should read --following,--.
Line 59, "first" should read --first,--.
Line 63, "However" should read --However,--.

COLUMN 13

Line 1, "Also" should read --Also,--.
Line 12, "SiO" should read --$SiO_2$--.
Line 63, "Sputtering" should read --sputtering--.

COLUMN 14

Line 4, "Subsequently" should read --Subsequently,--.
Line 25, "following" should read --following,--.

UNITED STATES PATENT AND TRADEMARK OFFICE
CERTIFICATE OF CORRECTION

PATENT NO. : 5,663,099
DATED : September 2, 1997
INVENTOR(S) : TAKAHIKO OKABE

It is certified that error appears in the above-indentified patent and that said Letters Patent is hereby corrected as shown below:

COLUMN 15

Line 13, "Also" should read --Also,--.
Line 16, "least.1m" should read --least 1 $\mu$m--.
Line 18, "following" should read --following,--.
Line 56, "Furthermore" should read --Furthermore,--.

COLUMN 16

Line 3, "Also" should read --Also,--.
Line 4, "T-Sin," should read --T-SiN,--.
Line 8, "Was" should read --was--.

Signed and Sealed this

Thirty-first Day of March, 1998

Attest:

BRUCE LEHMAN

*Attesting Officer*  *Commissioner of Patents and Trademarks*